(12) United States Patent
Chen et al.

(10) Patent No.: US 10,073,121 B2
(45) Date of Patent: Sep. 11, 2018

(54) INPUT-VOLTAGE-OFF DETECTION APPARATUS AND POWER SUPPLY WITH INPUT-VOLTAGE-OFF DETECTION APPARATUS

(71) Applicant: Chicony Power Technology Co., Ltd., New Taipei (TW)

(72) Inventors: Kuo-Yang Chen, New Taipei (TW); Chi-Tsung Wu, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 300 days.

(21) Appl. No.: 15/189,534

(22) Filed: Jun. 22, 2016

(65) Prior Publication Data

US 2017/0370972 A1    Dec. 28, 2017

(51) Int. Cl.
*G01R 19/155* (2006.01)
*G01R 15/04* (2006.01)

(52) U.S. Cl.
CPC ........... *G01R 19/155* (2013.01); *G01R 15/04* (2013.01)

(58) Field of Classification Search
CPC .... G01R 19/145; G01R 19/15; G01R 19/155; G01R 15/04; G01R 19/165; G01R 19/16519; G01R 19/16538; G01R 19/16547; G01R 19/16552; G06F 17/5009; G06F 2201/805; G06F 1/30; G06F 1/32; G06F 1/305; G06F 1/28; G06F 1/266; G06F 1/20; G06F 1/26; G06F 11/2015; G06F 11/2038; G06F 11/2046; G06F 11/1441; G06F 11/326; H02M 1/32; H02M 1/08; H02M 2001/0032; H02M 2001/0006; H02M 2001/0009; H02M 2001/0029; H02M 2001/0054; H02M 3/33523; H02M 3/33515; H02M 7/06; H02M 7/12; H02M 7/7575; H02M 3/156; H02M 3/28; H02M 3/33507

See application file for complete search history.

(56) References Cited

U.S. PATENT DOCUMENTS 4,658,204 A * 4/1987 Goodwin .............. H02M 3/156
                                                    323/285
5,437,040 A * 7/1995 Campbell .............. G01R 31/40
                                                    307/22

(Continued)

*Primary Examiner* — Tung X Nguyen
*Assistant Examiner* — Lee Rodak
(74) *Attorney, Agent, or Firm* — Muncy, Geissler, Olds & Lowe, P.C.

(57) ABSTRACT

An input-voltage-off detection apparatus includes a voltage adjustment unit, a time delay unit, a voltage clamp unit, an auxiliary voltage discharge switch unit and an isolation notification unit. The voltage adjustment unit receives an input voltage. The time delay unit utilizes the input voltage to generate a direct current voltage. After the input voltage is cut off, the direct current voltage stored in the time delay unit discharges to the voltage adjustment unit. When the direct current voltage reduces to a predetermined voltage, the auxiliary voltage discharge switch unit is turned on, so that an auxiliary voltage winding sends a working voltage to the isolation notification unit. After the isolation notification unit receives the working voltage, the isolation notification unit notifies an electronic apparatus that the input voltage is cut off.

8 Claims, 3 Drawing Sheets

(56) References Cited

U.S. PATENT DOCUMENTS

| | | | |
|---|---|---|---|
| 7,107,480 B1* | 9/2006 | Moshayedi | G06F 11/1441 |
| | | | 714/2 |
| 8,214,165 B2* | 7/2012 | Dishman | G01R 31/40 |
| | | | 702/193 |
| 2006/0146461 A1* | 7/2006 | Jones | G06F 1/30 |
| | | | 361/62 |
| 2007/0159227 A1* | 7/2007 | Wittman | G01R 19/16547 |
| | | | 327/306 |
| 2015/0169023 A1* | 6/2015 | Massarotti | G06F 1/30 |
| | | | 713/300 |

* cited by examiner

INPUT-VOLTAGE-OFF DETECTION APPARATUS AND POWER SUPPLY WITH INPUT-VOLTAGE-OFF DETECTION APPARATUS

BACKGROUND OF THE INVENTION

Field of the Invention

The present invention relates to a detection apparatus and a power supply, and especially relates to an input-voltage-off detection apparatus and a power supply with the input-voltage-off detection apparatus.

Description of the Related Art

The output voltage of the related art switching power supply has the design of the hold-up time. When the related art input-voltage-off detection apparatus detects that the input voltage (such as the city power) is off, the related art input-voltage-off detection apparatus will inform the electronic apparatus, so that the electronic apparatus can backup and store data and be ready for shutdown before the hold-up time is finished. Therefore, the related art input-voltage-off detection apparatus is very important. However, the disadvantage of the related art input-voltage-off detection apparatus is that the power loss is too high.

SUMMARY OF THE INVENTION

In order to solve the above-mentioned problems, an object of the present invention is to provide an input-voltage-off detection apparatus.

In order to solve the above-mentioned problems, another object of the present invention is to provide a power supply with the input-voltage-off detection apparatus.

In order to achieve the object of the present invention mentioned above, the input-voltage-off detection apparatus includes a voltage adjustment unit, a time delay unit, a voltage clamp unit, an auxiliary voltage discharge switch unit and an isolation notification unit. The voltage adjustment unit receives an input voltage. The time delay unit is electrically connected to the voltage adjustment unit and utilizes the input voltage to generate a direct current voltage. The voltage clamp unit is electrically connected to the voltage adjustment unit and the time delay unit. The auxiliary voltage discharge switch unit is electrically connected to the voltage adjustment unit, the time delay unit, the voltage clamp unit and an auxiliary voltage winding. The isolation notification unit is electrically connected to the auxiliary voltage winding, the auxiliary voltage discharge switch unit and an electronic apparatus. After the input voltage is cut off, the direct current voltage stored in the time delay unit discharges to the voltage adjustment unit. When the direct current voltage reduces to a predetermined voltage, the auxiliary voltage discharge switch unit is turned on, so that an auxiliary voltage winding sends a working voltage to the isolation notification unit. After the isolation notification unit receives the working voltage, the isolation notification unit notifies the electronic apparatus that the input voltage is cut off.

In order to achieve the object of the present invention mentioned above, the power supply includes the input-voltage-off detection apparatus, an auxiliary voltage winding, a main converter, a pulse width modulation controller, a primary side filtering capacitor, a bridge rectifier, an output side rectifier filter and a feedback circuit. The auxiliary voltage winding is electrically connected to the input-voltage-off detection apparatus. The main converter is electrically connected to the auxiliary voltage winding. The pulse width modulation controller is electrically connected to the auxiliary voltage winding and the main converter. The primary side filtering capacitor is electrically connected to the main converter. The bridge rectifier is electrically connected to the primary side filtering capacitor, the pulse width modulation controller and the auxiliary voltage winding. The output side rectifier filter is electrically connected to the main converter and an electronic apparatus. The feedback circuit is electrically connected to the output side rectifier filter, the electronic apparatus and the pulse width modulation controller. The input-voltage-off detection apparatus includes a voltage adjustment unit, a time delay unit, a voltage clamp unit, an auxiliary voltage discharge switch unit and an isolation notification unit. The voltage adjustment unit receives an input voltage. The time delay unit is electrically connected to the voltage adjustment unit and utilizes the input voltage to generate a direct current voltage. The voltage clamp unit is electrically connected to the voltage adjustment unit and the time delay unit. The auxiliary voltage discharge switch unit is electrically connected to the voltage adjustment unit, the time delay unit, the voltage clamp unit and the auxiliary voltage winding. The isolation notification unit is electrically connected to the auxiliary voltage winding, the auxiliary voltage discharge switch unit and the electronic apparatus. After the input voltage is cut off, the direct current voltage stored in the time delay unit discharges to the voltage adjustment unit. When the direct current voltage reduces to a predetermined voltage, the auxiliary voltage discharge switch unit is turned on, so that the auxiliary voltage winding sends a working voltage to the isolation notification unit. After the isolation notification unit receives the working voltage, the isolation notification unit notifies the electronic apparatus that the input voltage is cut off.

The advantage of the present invention is to provide an input-voltage-off detection apparatus with low power loss.

DETAILED DESCRIPTION OF THE INVENTION

Please refer to following detailed description and figures for the technical content of the present invention. The following detailed description and figures are referred for the present invention, but the present invention is not limited to it.

Figure 1:
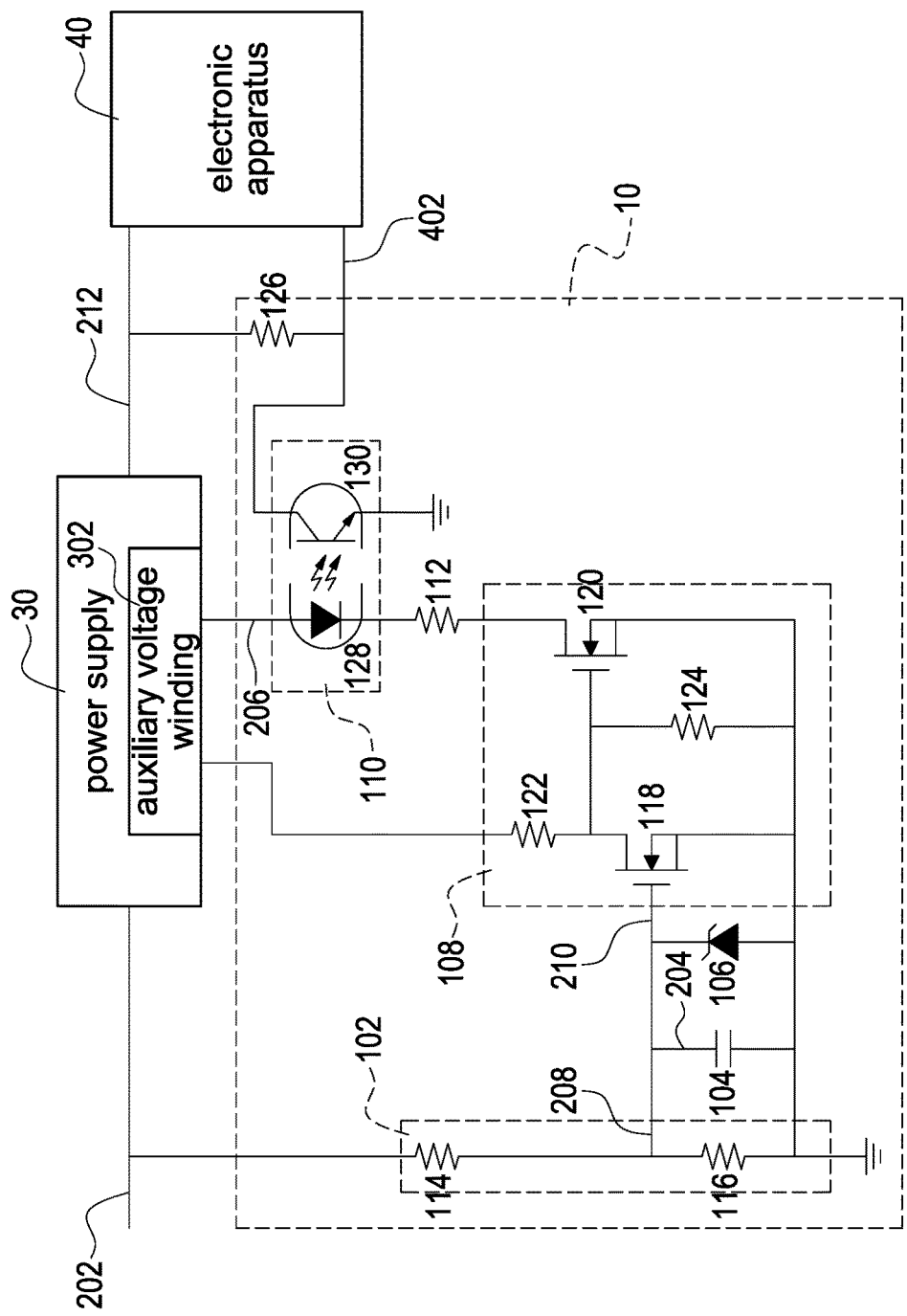
FIG. 1 shows a block diagram of the input-voltage-off detection apparatus of the present invention.

FIG. 1 shows a block diagram of the input-voltage-off detection apparatus of the present invention. An input-voltage-off detection apparatus 10 includes a voltage adjustment unit 102, a time delay unit 104, a voltage clamp unit 106, an auxiliary voltage discharge switch unit 108, an isolation notification unit 110, an auxiliary voltage discharge resistor 112 and a pull-up resistor 126. The voltage adjustment unit 102 includes a first voltage-dividing resistor 114 and a second voltage-dividing resistor 116. The auxiliary voltage discharge switch unit 108 includes a first transistor switch 118, a second transistor switch 120, a first resistor 122 and a second resistor 124.

The time delay unit 104 is, for example but not limited to, a capacitor. The voltage clamp unit 106 is, for example but not limited to, a Zener diode. The isolation notification unit 110 is, for example but not limited to, a photo coupler.

The time delay unit 104 is electrically connected to the voltage adjustment unit 102. The voltage clamp unit 106 is electrically connected to the voltage adjustment unit 102 and the time delay unit 104. The auxiliary voltage discharge switch unit 108 is electrically connected to the voltage adjustment unit 102, the time delay unit 104, the voltage clamp unit 106 and an auxiliary voltage winding 302 of a power supply 30. The isolation notification unit 110 is electrically connected to the auxiliary voltage winding 302, the auxiliary voltage discharge switch unit 108 and an electronic apparatus 40. The auxiliary voltage discharge resistor 112 is electrically connected to the isolation notification unit 110 and the auxiliary voltage discharge switch unit 108. The pull-up resistor 126 is electrically connected to the isolation notification unit 110, the power supply 30 and the electronic apparatus 40. The first voltage-dividing resistor 114 is electrically connected to the time delay unit 104, the voltage clamp unit 106 and the auxiliary voltage discharge switch unit 108. The second voltage-dividing resistor 116 is electrically connected to the time delay unit 104, the voltage clamp unit 106, the auxiliary voltage discharge switch unit 108 and the first voltage-dividing resistor 114. The first transistor switch 118 is electrically connected to the voltage adjustment unit 102, the time delay unit 104, the voltage clamp unit 106 and the auxiliary voltage winding 302. The second transistor switch 120 is electrically connected to the auxiliary voltage winding 302 and the first transistor switch 118. The first resistor 122 is electrically connected to the auxiliary voltage winding 302, the first transistor switch 118 and the second transistor switch 120. The second resistor 124 is electrically connected to the first transistor switch 118, the second transistor switch 120 and the first resistor 122.

Before an input voltage 202 (for example an alternating current voltage) is cut off:

The voltage adjustment unit 102 receives the input voltage 202. The first voltage-dividing resistor 114 and the second voltage-dividing resistor 116 divide the input voltage 202, so that a first divided voltage 208 is obtained at a connection point between the first voltage-dividing resistor 114 and the second voltage-dividing resistor 116. The first voltage-dividing resistor 114 and the second voltage-dividing resistor 116 send the first divided voltage 208 to the time delay unit 104 and the voltage clamp unit 106. The time delay unit 104 stores the first divided voltage 208 to obtain a direct current voltage 204. Namely, the time delay unit 104 utilizes the first divided voltage 208 from the input voltage 202 to generate the direct current voltage 204.

The time delay unit 104 and the voltage clamp unit 106 do filtering and stabilizing the first divided voltage 208 to obtain a stabilized voltage 210. The time delay unit 104 and the voltage clamp unit 106 send the stabilized voltage 210 to the first transistor switch 118 of the auxiliary voltage discharge switch unit 108. When the first transistor switch 118 of the auxiliary voltage discharge switch unit 108 receives the stabilized voltage 210 and when the first transistor switch 118 of the auxiliary voltage discharge switch unit 108 receives a voltage from the auxiliary voltage winding 302 through the first resistor 122, the first transistor switch 118 is conducted to ground, so that the second transistor switch 120 is not conducted, so that the auxiliary voltage winding 302 does not send a working voltage 206 to the isolation notification unit 110. Namely, the auxiliary voltage discharge switch unit 108 is not conducted, so that the auxiliary voltage winding 302 does not send the working voltage 206 to the isolation notification unit 110.

If the auxiliary voltage winding 302 does not send the working voltage 206 to the isolation notification unit 110, a signal transmitting side 128 of the isolation notification unit 110 is not conducted, so that a signal receiving side 130 of the isolation notification unit 110 is not connected to ground. If the signal receiving side 130 of the isolation notification unit 110 is not connected to ground, a signal input side 402 of the electronic apparatus 40 receives an output voltage 212 through the pull-up resistor 126, wherein the output voltage 212 is sent from the power supply 30 to the electronic apparatus 40. Therefore, the electronic apparatus 40 is aware that the input voltage 202 is not cut off.

After the input voltage 202 is cut off, the stabilized voltage 210 is no longer available. The direct current voltage 204 stored in the time delay unit 104 discharges to the second voltage-dividing resistor 116 of the voltage adjustment unit 102, and drives the first transistor switch 118 (at this time, the auxiliary voltage winding 302 still has remaining power to supply power to the first transistor switch 118). When the direct current voltage 204 is decreased to a predetermined voltage, the first transistor switch 118 is not conducted, so that the second transistor switch 120 is conducted (at this time, the auxiliary voltage winding 302 still has remaining power to supply power to the second transistor switch 120), so that the auxiliary voltage winding 302 sends the working voltage 206 to the isolation notification unit 110. Namely, the auxiliary voltage discharge switch unit 108 is conducted, so that the auxiliary voltage winding 302 sends the working voltage 206 to the isolation notification unit 110. When the second transistor switch 120 of the auxiliary voltage discharge switch unit 108 is conducted, the auxiliary voltage winding 302 discharges to the auxiliary voltage discharge resistor 112 through the isolation notification unit 110.

After the signal transmitting side 128 of the isolation notification unit 110 receives the working voltage 206, the signal transmitting side 128 of the isolation notification unit 110 is conducted to render the signal receiving side 130 of the isolation notification unit 110 is connected to ground. If the signal receiving side 130 of the isolation notification unit 110 is connected to ground, the signal input side 402 of the electronic apparatus 40 is connected to ground, so that the electronic apparatus 40 is aware that the input voltage 202 is cut off. Therefore, the electronic apparatus 40 can backup and store data and be ready for shutdown.

Figure 2:
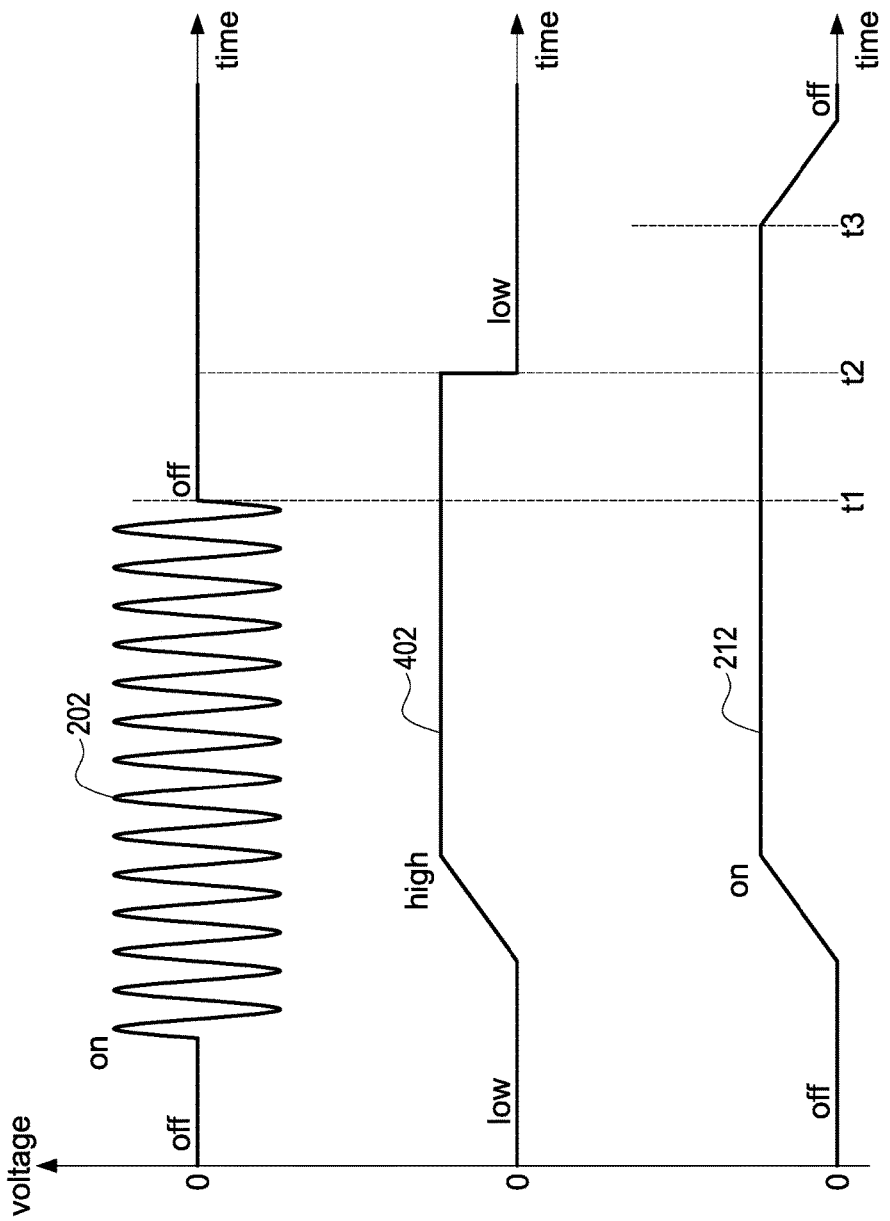
FIG. 2 shows a waveform diagram of the voltages and signals of the present invention.

FIG. 2 shows a waveform diagram of the voltages and signals of the present invention. In FIG. 2, from top to bottom the first waveform indicates the input voltage 202. From top to bottom the second waveform indicates the signal received by the signal input side 402 of the electronic apparatus 40. From top to bottom the third waveform indicates the output voltage 212 outputted from the power supply 30 to the electronic apparatus 40.

At a timing t1, the input voltage 202 is cut off. Duration between the timing t1 and a timing t2 is a delay time for informing that the input voltage 202 is cut off. At the timing t2, the electronic apparatus 40 is informed that the input voltage 202 is cut off. Between the timing t2 and a timing t3, the electronic apparatus 40 can backup and store data and be ready for shutdown. Between the timing t1 and the timing t3 is called a hold-up time of the power supply 30. Therefore, after the input voltage 202 is cut off and before the hold-up time is finished, deducting the duration between the timing t1 and the timing t2, the electronic apparatus 40 can backup and store data and be ready for shutdown.

Figure 3:
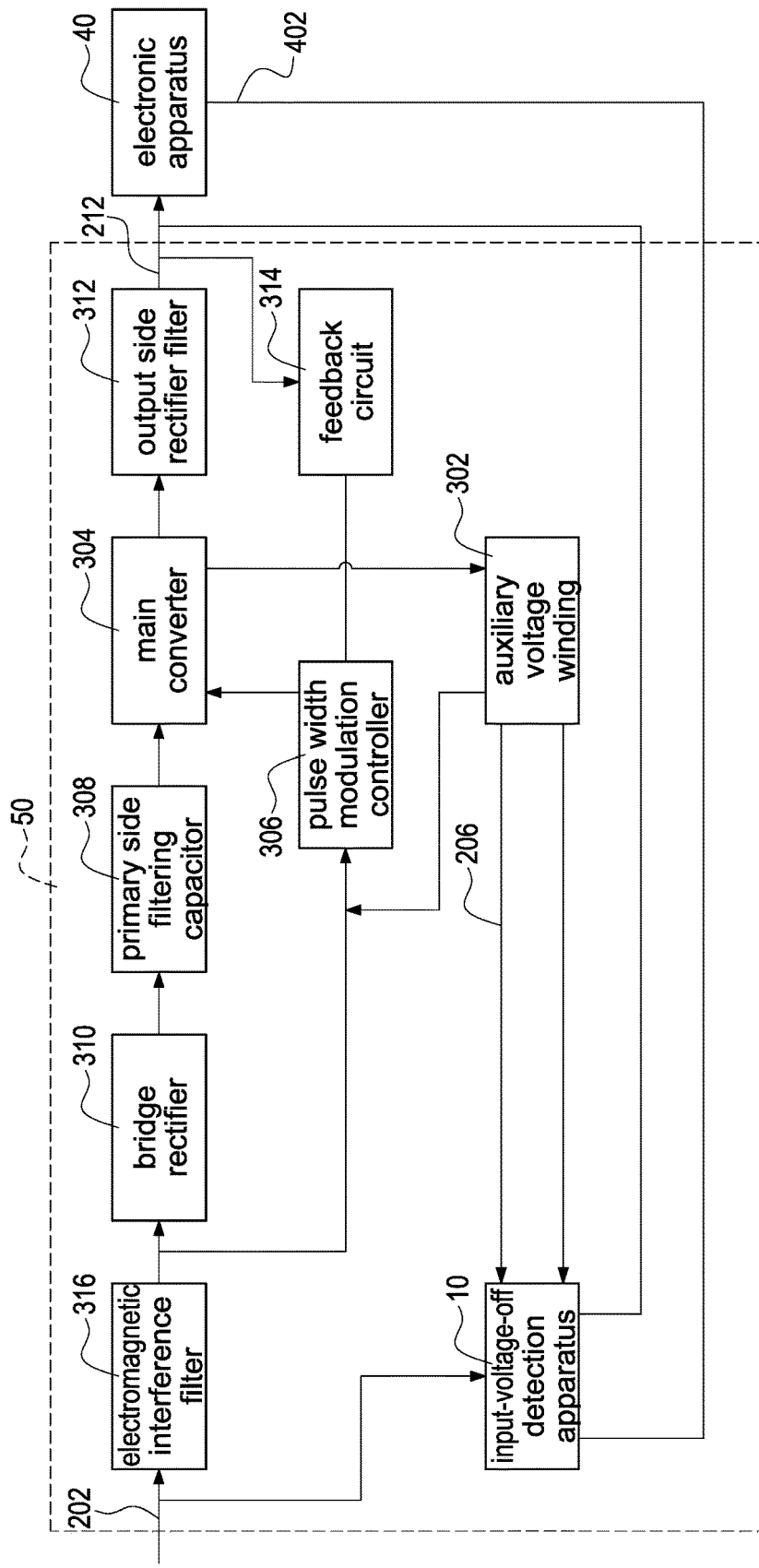
FIG. 3 shows a block diagram of the power supply of the present invention.

FIG. 3 shows a block diagram of the power supply of the present invention. A power supply 50 includes an input-voltage-off detection apparatus 10, an auxiliary voltage winding 302, a main converter 304, a pulse width modulation controller 306, a primary side filtering capacitor 308, a bridge rectifier 310, an output side rectifier filter 312, a feedback circuit 314 and an electromagnetic interference filter 316.

The auxiliary voltage winding 302 is electrically connected to the input-voltage-off detection apparatus 10. The main converter 304 is electrically connected to the auxiliary voltage winding 302. The pulse width modulation controller 306 is electrically connected to the auxiliary voltage winding 302 and the main converter 304. The primary side filtering capacitor 308 is electrically connected to the main converter 304. The bridge rectifier 310 is electrically connected to the primary side filtering capacitor 308, the pulse width modulation controller 306 and the auxiliary voltage winding 302. The output side rectifier filter 312 is electrically connected to the main converter 304 and an electronic apparatus 40. The feedback circuit 314 is electrically connected to the output side rectifier filter 312, the electronic apparatus 40 and the pulse width modulation controller 306. The electromagnetic interference filter 316 is electrically connected to the input-voltage-off detection apparatus 10, the bridge rectifier 310, the pulse width modulation controller 306 and the auxiliary voltage winding 302. The description for the elements of the input-voltage-off detection apparatus 10 shown in FIG. 3, which are similar to those shown in FIG. 1, is not repeated here for brevity.

The advantage of the present invention is to provide an input-voltage-off detection apparatus with low power loss. When the power supply detects that the output voltage or current is abnormal and then triggers the protection, the user cuts off the city power, and then the auxiliary-voltage-shutdown discharge circuit can render that the auxiliary voltage supplying to the primary side pulse width modulation controller rapidly discharges to a latch-reset threshold voltage of the primary side pulse width modulation controller. The user does not need to wait. After the power is cut off, the power can be sent again immediately. Because in the auxiliary-voltage-shutdown discharge circuit, the resistance of the voltage-dividing resistor detecting the city power is very high, the present invention has very low power loss. Moreover, because the photo coupler transmitting signals is driven by the discharge of the auxiliary voltage, transmitting the signal that the city power is cut off will not increase power loss. The present invention achieves combining the auxiliary-voltage-shutdown discharge and city power cut off detection at the same time, with very low power loss.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A power supply comprising:
an input-voltage-off detection apparatus;
an auxiliary voltage winding electrically connected to the input-voltage-off detection apparatus;
a main converter electrically connected to the auxiliary voltage winding;
a pulse width modulation controller electrically connected to the auxiliary voltage winding and the main converter;
a primary side filtering capacitor electrically connected to the main converter;
a bridge rectifier electrically connected to the primary side filtering capacitor, the pulse width modulation controller and the auxiliary voltage winding;
an output side filter electrically connected to the main converter and an electronic apparatus; and
a feedback circuit electrically connected to the output side filter, the electronic apparatus and the pulse width modulation controller,
wherein the input-voltage-off detection apparatus comprises:
a voltage adjustment unit receiving an input voltage;
a time delay unit electrically connected to the voltage adjustment unit and utilizing the input voltage to generate a direct current voltage;
a voltage clamp unit electrically connected to the voltage adjustment unit and the time delay unit;
an auxiliary voltage discharge switch unit electrically connected to the voltage adjustment unit, the time delay unit, the voltage clamp unit and the auxiliary voltage winding; and
an isolation notification unit electrically connected to the auxiliary voltage winding, the auxiliary voltage discharge switch unit and the electronic apparatus,
wherein after the input voltage is cut off, the direct current voltage stored in the time delay unit discharges to the voltage adjustment unit; when the direct current voltage reduces to a predetermined voltage, the auxiliary voltage discharge switch unit is turned on, so that the auxiliary voltage winding sends a working voltage to the isolation notification unit; after the isolation notification unit receives the working voltage, the isolation notification unit notifies the electronic apparatus that the input voltage is cut off.

2. The power supply in claim 1, wherein the input-voltage-off detection apparatus further comprises:
an auxiliary voltage discharge resistor electrically connected to the isolation notification unit and the auxiliary voltage discharge switch unit,
wherein when the auxiliary voltage discharge switch unit is conducted, the auxiliary voltage winding discharges to the auxiliary voltage discharge resistor through the isolation notification unit.

3. The power supply in claim 1, wherein the voltage adjustment unit comprises:
a first voltage-dividing resistor electrically connected to the time delay unit, the voltage clamp unit and the auxiliary voltage discharge switch unit; and
a second voltage-dividing resistor electrically connected to the time delay unit, the voltage clamp unit, the auxiliary voltage discharge switch unit and the first voltage-dividing resistor,
wherein the first voltage-dividing resistor and the second voltage-dividing resistor divide the input voltage, so that a first divided voltage is obtained at a connection point between the first voltage-dividing resistor and the second voltage-dividing resistor; the first voltage-dividing resistor and the second voltage-dividing resistor send the first divided voltage to the time delay unit and the voltage clamp unit; the time delay unit stores the first divided voltage to obtain a direct current voltage;

the time delay unit and the voltage clamp unit do filtering and stabilizing the first divided voltage to obtain a stabilized voltage; the time delay unit and the voltage clamp unit send the stabilized voltage to the auxiliary voltage discharge switch unit; when the auxiliary voltage discharge switch unit receives the stabilized voltage, the auxiliary voltage discharge switch unit is not conducted, so that the auxiliary voltage winding does not send the working voltage to the isolation notification unit;

wherein after the input voltage is cut off, the direct current voltage stored in the time delay unit discharges to the second voltage-dividing resistor.

4. The power supply in claim 1, wherein the auxiliary voltage discharge switch unit comprises:

a first transistor switch electrically connected to the voltage adjustment unit, the time delay unit, the voltage clamp unit and the auxiliary voltage winding; and a second transistor switch electrically connected to the auxiliary voltage winding and the first transistor switch, wherein when the first transistor switch receives the stabilized voltage, the first transistor switch is conducted to ground, so that the second transistor switch is not conducted, so that the auxiliary voltage winding does not send the working voltage to the isolation notification unit; when the direct current voltage is decreased to the predetermined voltage, the first transistor switch is not conducted, so that the second transistor switch is conducted, so that the auxiliary voltage winding sends the working voltage to the isolation notification unit.

5. The power supply in claim 4, wherein the auxiliary voltage discharge switch unit further comprises:

a first resistor electrically connected to the auxiliary voltage winding, the first transistor switch and the second transistor switch; and a second resistor electrically connected to the first transistor switch, the second transistor switch and the first resistor.

6. The power supply in claim 1, wherein the isolation notification unit is a photo coupler.

7. The power supply in claim 1 further comprising:

an electromagnetic interference filter electrically connected to the input-voltage-off detection apparatus, the bridge rectifier, the pulse width modulation controller and the auxiliary voltage winding.

8. An input-voltage-off detection apparatus comprising:

a voltage adjustment unit receiving an input voltage;

a time delay unit electrically connected to the voltage adjustment unit and utilizing the input voltage to generate a direct current voltage;

a voltage clamp unit electrically connected to the voltage adjustment unit and the time delay unit;

an auxiliary voltage discharge switch unit electrically connected to the voltage adjustment unit, the time delay unit, the voltage clamp unit and an auxiliary voltage winding; and an isolation notification unit electrically connected to the auxiliary voltage winding, the auxiliary voltage discharge switch unit and an electronic apparatus, wherein after the input voltage is cut off, the direct current voltage stored in the time delay unit discharges to the voltage adjustment unit; when the direct current voltage reduces to a predetermined voltage, the auxiliary voltage discharge switch unit is turned on, so that the auxiliary voltage winding sends a working voltage to the isolation notification unit; after the isolation notification unit receives the working voltage, the isolation notification unit notifies the electronic apparatus that the input voltage is cut off.

* * * * *